US008866245B2

(12) United States Patent
Spencer et al.

(10) Patent No.: US 8,866,245 B2
(45) Date of Patent: Oct. 21, 2014

(54) NUCLEAR BATTERIES

(75) Inventors: Michael Spencer, Ithaca, NY (US); Mvs Chandrashekhar, Columbia, SC (US); Chris Thomas, Ithaca, NY (US)

(73) Assignee: Widetronix, Inc., Ithaca, NY (US)

( * ) Notice: Subject to any disclaimer, the term of this patent is extended or adjusted under 35 U.S.C. 154(b) by 304 days.

(21) Appl. No.: 13/351,223

(22) Filed: Jan. 16, 2012

(65) Prior Publication Data

US 2012/0133244 A1 May 31, 2012

Related U.S. Application Data

(63) Continuation of application No. 13/042,444, filed on Mar. 7, 2011, now Pat. No. 8,134,216, which is a continuation-in-part of application No. 12/888,521, filed on Sep. 23, 2010, now Pat. No. 8,017,412, and a continuation-in-part of application No. 12/851,555, filed on Aug. 6, 2010, now Pat. No. 8,487,392.

(60) Provisional application No. 61/250,504, filed on Oct. 10, 2009, provisional application No. 61/231,863, filed on Aug. 6, 2009, provisional application No. 61/306,541, filed on Feb. 21, 2010.

(51) Int. Cl.
*H01L 27/14* (2006.01)
*G21H 1/02* (2006.01)

(52) U.S. Cl.
CPC .................................... *G21H 1/02* (2013.01)
USPC ........ 257/428; 257/19; 257/56; 257/E21.465; 257/29

(58) Field of Classification Search
USPC ......................... 257/428, 19, 56, 29, E21.465
See application file for complete search history.

(56) References Cited

U.S. PATENT DOCUMENTS

| | | | | |
|---|---|---|---|---|
| 3,510,094 | A * | 5/1970 | Clark | 244/130 |
| 5,859,484 | A * | 1/1999 | Mannik et al. | 310/303 |
| 2009/0026879 | A1* | 1/2009 | Prelas | 310/303 |
| 2010/0037937 | A1* | 2/2010 | Sater | 136/249 |

* cited by examiner

*Primary Examiner* — Jarrett Stark
(74) *Attorney, Agent, or Firm* — Maxvalueip LLC

(57) ABSTRACT

We introduce a new technology for Manufactureable, High Power Density, High Volume Utilization Nuclear Batteries. Betavoltaic batteries are an excellent choice for battery applications which require long life, high power density, or the ability to operate in harsh environments. In order to optimize the performance of betavoltaic batteries for these applications or any other application, it is desirable to maximize the efficiency of beta particle energy conversion into power, while at the same time increasing the power density of an overall device. Various devices and methods to solve the current industry problems and limitations are presented here.

20 Claims, 12 Drawing Sheets

(a) (b)

NUCLEAR BATTERIES

RELATED APPLICATIONS

This current application is a continuation of a application Ser. No. 13/042,444, filed Mar. 7, 2011 now U.S. Pat. No. 8,134,216, with the same title, inventors, assignee, and specification, which was recently allowed. Thus, this current application incorporates by reference all of the teachings and specification of its parent case, as also included here.

Ser. No. 13/042,444 in turn is a continuation-in-part of (and related to) U.S. application Ser. No. 12/888,521 filed Sep. 23, 2010 now U.S. Pat. No. 8,017,412, and Ser. No. 12/851,555, filed Aug. 6, 2010 now U.S. Pat. No. 8,487,392, which are based on the provisional applications 61/250,504, filed Oct. 10, 2009, 61/231,863, filed Aug. 6, 2009, and 61/306,541, filed Feb. 21, 2010, with common inventor(s), and same assignee (Widetronix Corporation). All of the above teachings are incorporated by reference here.

BACKGROUND OF THE INVENTION

We introduce a new technology for Manufactureable, High Power Density, High Volume Utilization Nuclear Batteries. Betavoltaic batteries are an excellent choice for battery applications which require long life, high power density, or the ability to operate in harsh environments. In order to optimize the performance of betavoltaic batteries for these applications or any other application, it is desirable to maximize the efficiency of beta particle energy conversion into power, while at the same time increasing the power density of an overall device. Increasing power density is a difficult problem because, while both the active area of the semiconductor used for the beta energy conversion and the layer of radioisotope that provides the betas for this conversion are very thin (100's of nanometers), the thickness of the substrate supporting the radioisotope layer and the overall thickness of the semiconductor device wafers are on the order of 100's of microns.

In another embodiment for this technology, there are several technical constraints that must be considered when designing a low cost, manufacturable, high volume, high power density silicon carbide (SiC) betavoltaic device. First, consideration must be given to the energy profile of radioisotopes to be used, and the volume at which such material can be produced. For example, tritium is one of the several viable radioisotope candidates, since it can be produced in sufficient quantities to support high volume device manufacture, and its energy profile fits well with a range of power generation design parameters.

Secondly, in order to produce high power density in betavoltaics, a large device surface area is required. There are issued and pending betavoltaic patents that mention patterning methods for pillars, pores or other structures which yield such high surface area—patent application Ser. No. 11/509,323 is an example, and can be used as a reference for pillared betavoltaic device construction. These methods must be optimized appropriately in order to meet fabrication objectives, while controlling costs.

Thirdly, SiC has been shown to be the ideal material for betavoltaic devices, e.g. see reference patent application Ser. No. 11/509,323. However, SiC has unique processing, fabrication and design requirements which must be met in order to produce a workable device. For example, fabrication of SiC devices requires high temperature epitaxial processes. Because of such high temperature requirements, these epitaxial processes add an element of complexity and cost, not seen with processes relating to other semiconductors, such as Si, and must be taken into account accordingly, or fabrication techniques must be developed to remove such complex and costly processes entirely.

Fourthly, it is desirable to integrate betavoltaic devices directly with Silicon (Si)-based electronics, including, but not limited to, microprocessor and memory devices. Thus, there is a need for designs and fabrication processes which anticipate such integration.

Devices which address or anticipate the aforementioned design considerations are disclosed in this current or co-pending applications, as mentioned above. Methods for fabricating same are also disclosed.

SUMMARY OF THE INVENTION

The small (submicron) thickness of the active volume of both the isotope layer and the semiconductor device is due to the short absorption length of beta electrons. The absorption length determines the self absorption of the beta particles in the radioisotope layer as well as the range, or travel distance, of the betas in the semiconductor converter which is typically a semiconductor device comprising at least one PN junction. We define a volume utilization factor, $Vol_{utilization}$, to quantitatively track how well a betavoltaic device is using the volume of the radioisotope source and the volume of the semiconductor converter (equation 1). To illustrate this, consider the simple betavoltaic structure shown in FIG. 1. There are three important length scales for optimization of such a device:

1) the self absorption length of the beta electrons in the radioisotope 2) the range of the beta electrons in the semiconductor converter material 3) the diffusion length of minority carriers in the semiconductor, $L_{diff}$.

$L_{diff}$ determines the maximum thickness of any doped region (p-type or n-type) forming the PN junction. Note that although these design principles apply to any semiconductor material, including, but not limited to Si, GaAs, GaN, and diamond, herein, we focus on SiC because SiC has been shown to be the ideal material for a beta converter.

Also, this invention can be implemented using any beta emitting radioisotopes. Herein, we will consider the three isotopes Nickel-63 ($N^{63}$), tritium ($H^3$) and the tritides (Scandium Tritide, Titanium Tritide, etc.), and promethium-147 ($Pm^{147}$). These isotopes have properties as listed in table 1. In this illustration for a simple structure shown in FIG. 1, the radioisotope is supplied by means of a foil. This foil could be carrying either $N^{63}$, a tritiated metal such as scandium Tritide, or $Pm^{147}$. We denote the range of the betas in SiC as $L_{SiC}$ and the self absorption length in the radioisotope as $L_{isotope}$. The volume utilization in this geometry, neglecting the contacts and isotope volume, is calculated as:

$$Vol_{utilization} = \frac{(t_{cell})\text{Area}}{(t_{substrate} + t_{cell})\text{Area}} = \frac{(t_{cell})}{(t_{substrate} + t_{cell})} \quad (1)$$

Where

Area=the total device area, and $t_{substrate}$=the thickness of the SiC substrate $t_{cell}$=the thickness of the active SiC region.

Note that the value of $Vol_{utilization}$ is between zero and one.

In order to maximize the power output, this planar style betavoltaic device has to be designed to capture as close to all of the beta electrons leaving the surface of the foil as possible.

This means that $t_{cell}$ must be at least greater than the diffusion length of the minority carriers ($t_{cell}>L_{diff}$). However, any material thicker than this limit will not actively participate in energy conversion, so while $t_{cell}>L_{diff}$ must be true, $t_{cell}$ must be as close as possible to $L_{diff}$ so as to maximize volume utilization. Further, the location of the PN junction depth from the surface of the device must be $<L_{diff}$ in order to collect the maximum number of electron hole-pairs.

In addition, one embodiment of this invention is a novel SiC betavoltaic device which comprises one or more "ultra shallow" P+N⁻ SiC junctions and a pillared or planar device surface. Junctions are deemed "ultra shallow", since the thin junction layer (which is proximal to the device's radioactive source) is only 300 nm to 5 nm thick. In one embodiment of this invention, tritium is used as a fuel source. In other embodiments, radioisotopes (such as Nickel-63, promethium or phosphorus-33) may be used. This is also addressed in our co-pending applications, mentioned above.

DETAILED EMBODIMENTS OF THE INVENTION

Figure 1:
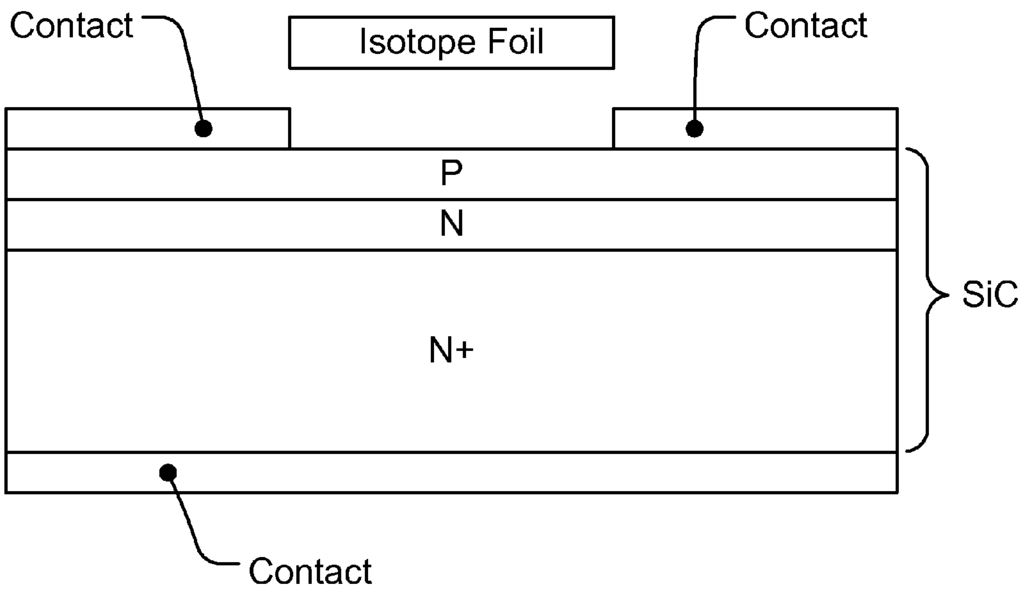
FIG. 1 shows schematic of beta voltaic converter, corresponding to FIG. 5.

Here are some embodiments of this invention:

In order to maximize the power output, this planar style betavoltaic device has to be designed to capture as close to all of the beta electrons leaving the surface of the foil as possible. This means that $t_{ell}$ must be at least greater than the diffusion length of the minority carriers ($t_{cell}>L_{diff}$). However, any material thicker than this limit will not actively participate in energy conversion, so while $t_{cell}>L_{diff}$ must be true, $t_{cell}$ must be as close as possible to $L_{diff}$ so as to maximize volume utilization. Further, the location of the PN junction depth from the surface of the device must be $<L_{diff}$ in order to collect the maximum number of electron hole-pairs.

TABLE I

| β-emitting radioisotope and their ranges in SiC and self absorption lengths | | | |
|---|---|---|---|
| β-Emitting Isotopes | Mean energy | Self absorption length (at mean beta energy) | SiC absorption length (at mean beta energy) |
| $N_{63}$ | 17.4 keV | 0.67 μm | 1.84 μm |
| Scandium Trititide | 5.6 keV | 0.27 μm | 0.25 μm |
| Promethium | 67 keV | 8.59 μm | 19.56 μm |

Once the output power has been maximized, the only way to increase the power density is to reduce the thickness of the substrate by wafer polishing. A typical SiC wafer is about 350 microns, so if the thickness of the substrate was reduced to 50 microns, this would result in a seven times increase in power density.

The total power out of this planar betavoltaic device is given by:

$$P_{Total}=Ct_{isotope}\text{Area}(S_{SSA}) \tag{2}$$

If we take into account the substrate thickness $t_{substrate}$, the power density produced by this geometry is given as:

$$\begin{aligned} P_{Density} &= \frac{P_{Total}}{\text{Total Device Volume}} \\ &= \frac{Ct_{isotope}\text{Area}(S_{SSA})}{(t_{substrate}+t_{cell})\text{Area}} \\ &= \frac{Ct_{isotope}S_{SSA}}{(t_{substrate}+t_{cell})} \end{aligned} \tag{3}$$

The conversion constant C takes into account the energy per beta electron the semiconductor loses (phonon, recombination etc.), the reflection of beta electrons at the semiconductor interface, the emission spectrum of the foil, and is directly related to the device efficiency. 'Area' is the area of the device as viewed from the top, and the thickness of the radioisotope is denoted by $t_{isotope}$. $S_{SSA}$ is the specific surface activity, and is defined as the number of electrons per unit area which leaves the surface of the foil in the direction of the converter. This quantity is a measured value for a particular foil.

For a particular thickness, $t_{isotope}$, of the radioisotope, only the betas that are not self absorbed leave the surface and are made available for harvesting by the SiC converter. This thickness of the radioisotope within which all the beta particles generated can leave the surface is called the self absorption length. The self absorption length of the beta particles with average energy is denoted by $L_{isotope}$. For the semiconductor, the range of penetration into the SiC of the beta particles with average energy is denoted by $L_{SiC}$. Both $L_{SiC}$ and $L_{isotope}$ are calculated from the following relationship.

$$\text{Range(in microns)} = \frac{4}{100\rho}E(\text{in keV})^{1.75} \tag{4}$$

where ρ is the density of either SiC or the radioisotope foil, and an expression for the ratio of the density of the two SiC to radioisotope can be written as:

$$\frac{L_{SiC}}{L_{isotope}} = \frac{\rho_{isotope}}{\rho_{SiC}} \tag{5}$$

An Embodiment

One embodiment of the invention is shown in FIG. 2. While the invention can be implemented with multiple junctions, this first embodiment will be described using a single junction. The top part of FIG. 2 shows the starting geometry which can be viewed as a combination of two slabs—a radioisotope slab and a SiC converter slab. The top slab (shown in red) is the radioisotope slab, and the bottom slab (shown in blue and yellow) is the PN junction slab. The top surface cross sectional dimensions (not shown) of the semiconductor slab are $cell_x$ and $cell_y$ in the x and y directions respectively, and the z dimension (the thickness of the junction, also not shown) is denoted by $t_{cell}$. In one example, we introduce additional isotope slabs to completely surround up to all four sides of the PN junction slab plus one isotope slab covering the junction slab's bottom or top surface or two additional slabs covering both the top and bottom junction surface. Multiple, and typically thousands, of these isotope enclosed semiconductor slabs will be fabricated across the wafer, resulting in a total top surface area of semiconductor slabs and isotope slabs equal to the final footprint of the new betavoltaic device. For comparison purposes, in this document, the total surface area of the high volume utilization betavoltaic design will approximate the original planar betavoltaic geometry area denoted as "Area" in the description of that planar device in the section above.

Note that there can be embodiments of this high volume utilization betavoltaic invention that use two isotope slabs, or three, or up to six isotope slabs, or e.g. the maximum number that can be physically added. For a given thickness of the junction, $t_{cell}$, an increase in the number of isotope slabs will lead to an increase in the amount of beta electrons per unit volume available for harvesting by the betavoltaic, and therefore, an increase in the amount of power out for the overall total area of a device.

Figure 2A:
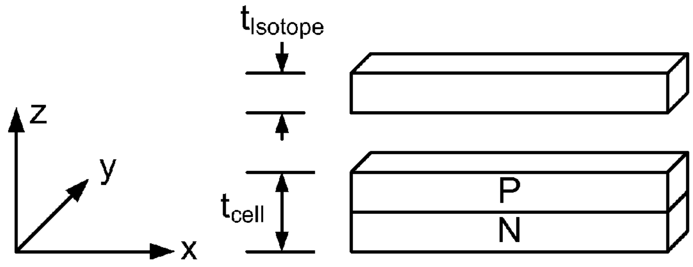
FIGS. 2*a-c* show: Schematic illustration of one embodiment of the invention, corresponding to FIGS. 6*a-c*. The drawing shows a slap converter geometry being replaced by a number of cube-based converters.
Figure 2B:
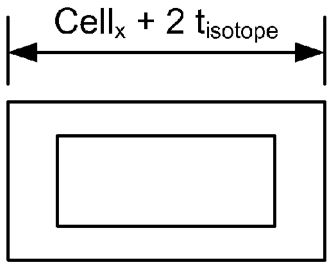

The relationship between the total area of the betavoltaic device and the cross sectional area, $A_{cell}$, of the individual semiconductor slabs can be found by taking advantage of the square cross section of the slab design and creating a unit cell that includes both the semiconductor slab cross section and the isotope slabs surrounding it as shown in FIG. 2*b*.

Then the area of the unit cell, $A_{uc}$, is given by:

$$A_{uc}=(\text{cell}_x+2t_{isotope})(\text{cell}_Y+2t_{isotope}) \tag{6}$$

For illustrative purposes, the semiconductor slab dimensions cell and $cell_s$ shall be equal, however, in some embodiments of the invention this may not be the case. If cell and $cell_s$ are equal, then:

$$\text{cell}_x=\text{cell}_Y$$

And $A_{uc}$ becomes:

$$A_{uc}=(\text{cell}_x+2t_{isotope})(\text{cell}_x+2t_{isotope})$$

$$A_{uc}=(\text{cell}_x+2t_{isotope})^2 \tag{6b}$$

The total area, denoted as "Area", covered by all the N unit cells on the device is equal to:

$$\text{Area}=N(\text{cell}_x+2t_{isotope})^2 \tag{7}$$

And N, the number of cells in the active area of the device, can be found from:

$$N = \frac{\text{Area}}{(cell_x + 2t_{isotope})^2} \tag{7a}$$

The values of each of the parameters defined above are determined by the material characteristics of both the isotope and the semiconductor. The following is a listing of the parameters and their determining material characteristics:

$t_{cell}$: This parameter is determined by the minority carrier diffusion length, $L_{diff}$, of the semiconductor material. It is important that all the electron hole pairs that are formed in the device active area can make it back to the junction. Keeping $t_{cell}$ close to $L_{diff}$ will ensure the maximum collection of electron-hole pairs. In some embodiments of the invention, the range for $t_{cell}$ can be 1 μm to 150 μm.

$cell_x$: This parameter is determined by the range of the betas in the semiconductor, which means that it is also isotope dependent. Because there are isotope slabs on all four sides of the semiconductor slab in one or more embodiments of the invention, then for these embodiments, the cross section of the semiconductor slab can be substantially square to give equal range to the betas in all directions. In some of these embodiments of the invention, the range for cell can be 0.5 μm to 250 μm.

$t_{isotope}$: This parameter is determined by the self absorption length, $L_{isotope}$, of the betas in their respective isotope sources. In one embodiment, $t_{isotope}$ is at least equal to $L_{isotope}$ to ensure the most efficient volumetric use of the isotope slab. In some embodiments of the invention, the range for $t_{isotope}$ can be 0.1 μm to 20 μm.

One of the major differences between the planar betavoltaic design as well as designs which use textured active device areas with PN junctions that are conformal to a textured surface geometry, and this new high volume utilization betavoltaic invention is that certain surfaces/faces of as many as four isotope slabs are substantially perpendicular to one or more semiconductor slab PN junctions, thus, a significant amount of the betas whose energy are being harvested and used for power conversion enter the device in both the n-type and p-type regions within a diffusion length, $L_{diff}$, of the junction(s). Using this configuration, we can significantly increase the number of betas per unit volume which can be harvested which will directly impact the total power output of the cell, as well as the power density.

To further illustrate the improvements of the invention over a planar device, we can calculate the relative power, $P_{Rel}$, of the new high volume utilization betavoltaic design relative to the standard planar betavoltaic design. The relative power is the ratio of the power of the high volume utilization geometry to the power of the planar single isotope slab geometry, or:

$$P_{Rel} = \frac{P_{multi-slab}}{P_{planar}} \tag{8}$$

The following are examples of $P_{rel}$ calculations for 6, 5 and 3 isotope slabs. As mentioned herein, other slab configurations in terms of slab quantity and position are possible.

The power for the high volume utilization betavoltaic invention with six isotope slabs, $P_{6\ slabs}$, is given by $$P_{6\ slabs}=\{Ct_{isotope}\{[4\text{cell}_x t_{cell}]+[2(\text{cell}_x)^2]\}S_{SSA}\}N\alpha_{edge}^2 \tag{9}$$

Where $\alpha_{edge}$ is an edge effect factor that adjusts for the intrinsic attenuation of the beta current from the isotope slabs around each individual SiC cell.

To calculate $P_{rel}$ we need the output power for the planar betavoltaic which was given in equation (2a) as:

$$P_{Planar}=Ct_{isotope}\text{Area}(S_{SSA}) \quad (2a)$$

Therefore, $$P_{Rel-6\,sides}=\frac{P_{6\,slabs}}{P_{planar}}=\frac{[[4cell_x t_{cell}]+2(cell_x)^2]N\alpha_{edge}^2}{\text{Area}} \quad (10)$$

But from equation (7a) we know that:

$$N=\frac{\text{Area}}{(cell_x+2t_{isotope})^2} \quad (7a)$$

So substituting (7a) in (10), we get, $$P_{Rel-6\,sides}=\frac{(4t_{cell}cell_x+2(cell_x)^2)(\text{Area})\alpha_{edge}^2}{\text{Area}(cell_x+2t_{isotope})^2} \quad (10a)$$

Which gives, $$P_{Rel-6\,sides}=\frac{(cell_x)^2\left(4\frac{t_{cell}}{cell_x}+2\right)\alpha_{edge}^2}{(cell_x+2t_{isotope})^2}$$

And finally, $$P_{Rel-6\,sides}=\frac{\left(4\frac{t_{cell}}{cell_x}+2\right)\alpha_{edge}^2}{\left(1+\frac{2t_{isotope}}{cell_x}\right)^2} \quad (10\,aa)$$

If we only consider 5 radioisotope slabs, around the SiC cell (remove the bottom isotope), then the ratio for 5 is given by $$P_{Rel-6\,sides}=\frac{\left(4\frac{t_{cell}}{cell_x}+1\right)\alpha_{edge}^2}{\left(1+\frac{2t_{isotope}}{cell_x}\right)^2} \quad (11)$$

Similarly, for 3 isotope slabs (one on top, two on the sides) the ratio becomes $$P_{Rel-3\,sides}=\frac{\left(2\frac{t_{cell}}{cell_x}+1\right)\alpha_{edge}}{\left(1+\frac{2t_{isotope}}{cell_x}\right)^2} \quad (12)$$

The power density of the high volume utilization betavoltaic device is also an importance metric. The equation for the power density of a device with six isotope slabs, for example, is given by:

$$P_{Density}=\left\{\frac{C\{[4t_{cell}cell_x]+[2(cell_x)^2]\}S_{SSA}}{(t_{substrate}+t_{cell})\text{Area}}\right\}\frac{\alpha_{edge}^2\ \text{Area}}{(cell_x+2t_{isotope})^2}$$

Single Junction $Ni_{63}$ Embodiment of Invention

Figure 3:
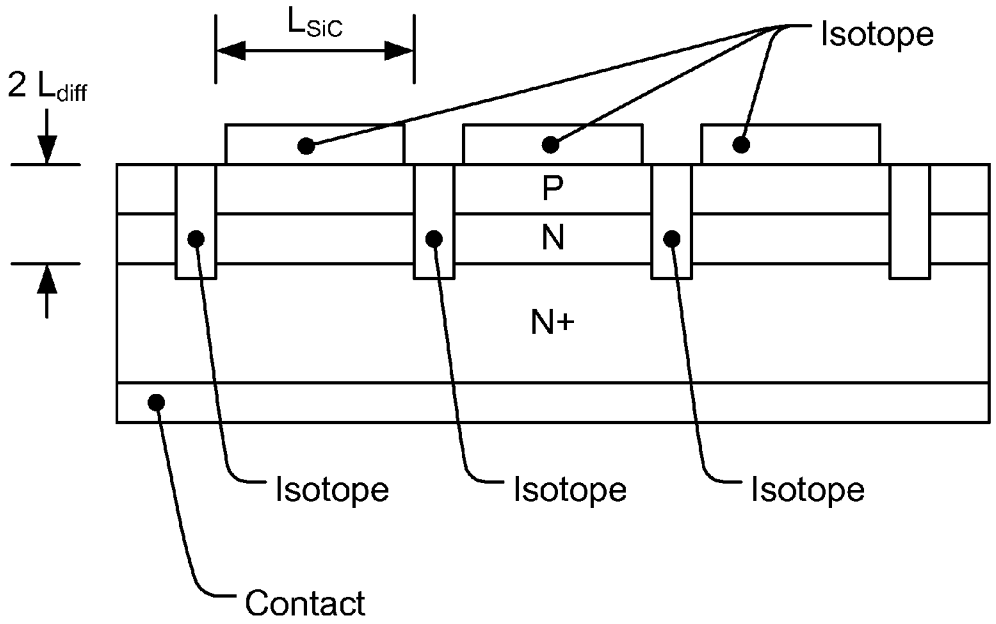
FIG. 3 shows: Schematic of a beta voltaic device embodiment, corresponding to FIG. 7.

The present invention may have embodiments as a single or multi junction device with either $Ni_{63}$, tritium, or promethium-147, or other beta emitting isotopes. The following describes an embodiment of the invention which comprises a single junction with Ni63 used as the isotope source. This embodiment is shown in FIG. 3. In this case we have a single P/N junction surrounded by 3 slabs of radioisotopes shown in blue. The isotopes are electrically isolated from the P/N junction by a thin oxide layer (not shown). The N+ region is the SiC substrate.

Figure 4:
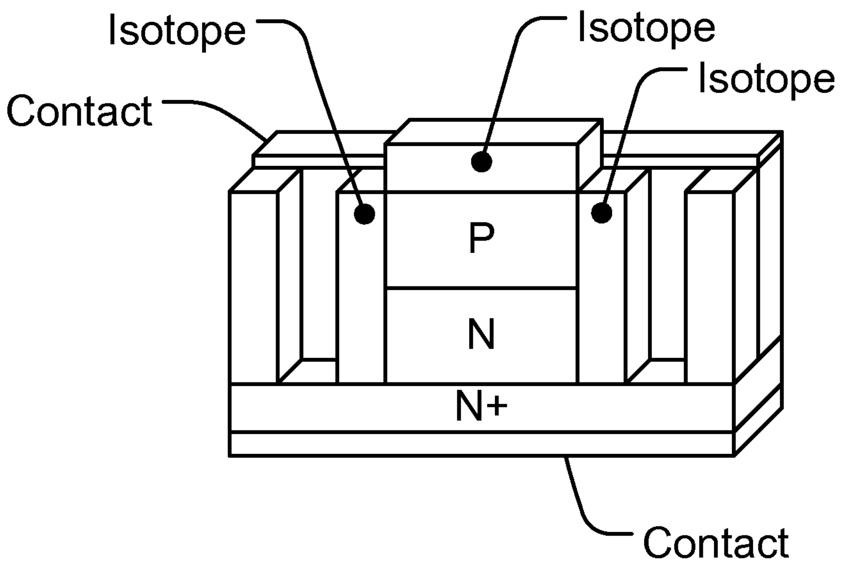
FIG. 4 shows a 3D representation, corresponding to FIG. 8. For clarity, space is inserted between the isotope vertical slabs. Ohmic contacts are formed in the rear of the device and on the devices bottom side.

FIG. 4 shows a 3D representation of this embodiment. For clarity, space is inserted between the adjacent radioisotope vertical slabs, where such space would normally be occupied by PN layers. Ohmic contacts are formed in the rear of the device and on the back of the substrate, and these contacts are shown in black.

Edge Effects and Design Equations

Typically, in designing a betavoltaic device, assumptions can be made regarding beta radiation traveling in a straight line with a density proportional to the specific activity. This is a good approximation for the planar case where the length of the foil is large compared to the absorption length in the SiC. However for the present invention, as one example, for each individual cell, one must take into account the edge effects for each mini cell. For a given beta energy and beta emitter position, the beta emitter will emit betas in all directions (all 360 degrees around). There will be an angle α which defines the edge effects. For angles less than 180 degrees there will be a loss of potential carriers given by α/180. We use the expression $\alpha_{edge}$ in the above equations to represent the edge effects as a dimensionless quantity that takes into account carrier loss.

Fabrication of the High Volume Utilization Structure

One exemplary method for the fabrication of the high volume utilization betavoltaic invention is as follows:

1—Deep Silicon Carbide Etch:

The channels for the vertical radioisotope slabs have to be etched first. This etch depth exposes the entire thickness of the active SiC cell to the radioisotope.

2—Oxide Passivation

Thermal oxide will be grown on the SiC to serve as insulation from the shorting of the device junction on the sidewalls of the individual cells.

3—Amorphous Silicon Deposition

A layer of amorphous Silicon (a-Si) will be blanket deposited over the deeply etched SiC wafer to allow for the re-planarization of the top surface.

4—CMP Planarization

To ensure that lithography can be performed on the patterned surface of the SiC sample after etching, the a-Si deposited on the sample in the previous step has to be planarized. This planarization step provides a flat template for the subsequent photoresist and lithographic processes.

5—Wet Oxide Etch

A wet oxide etch is done to remove any residual oxide that might be on the surface of the SiC before the metals for the ohmic contact are deposited. The presence of oxide would compromise the quality of the ohmic contact.

6—Ohmic Contact Metallization

The metallization for the formation of ohmic contacts to p-type SiC is selectively deposited on the top surface of the SiC cells.

7—Reactive Ion Etch Removal of a-Si in Trenches

The a-Si is removed from the surface of the device by Reactive Ion Etching (RIE)

8—Rapid Thermal Anneal

The ohmic contact metallization deposited in step 6 is now annealed using a Rapid Thermal Annealer (RTA). This step forms low resistance contacts to the SiC devices.

9—Frontside Ni Blanket Metallization

After the ohmic contacts are formed and annealed, a final blanket Nickel metallization will be done to connect all the individual SiC betavoltaic cells together and to serve as a seed layer for the eventual electroplated Nickel-63 radioisotope layer.

10—Backside Metallization

The SiC betavoltaic device is a vertical device and as such may have an ohmic contact on the front and back of the device. This step forms the ohmic contact on the backside of the device.

Summary of Some of the Advantages of this Embodiment for $Ni_{63}$

We can summarize some of the advantages of this invention, as one embodiment:

1. The $V_{Utilization}$ factor for this structure ~1 because all of the material is either emitting or collecting betas
2. Because of the high volume utilization, the power density will increase
3. This structure can efficiently allow for series combining of junctions to allow for a higher voltage output
4. This structure allows for the deposition of $Ni_{63}$ by electro chemistry because the "seed" layer for the deposition is at the bottom of the isotope channel and does not "shield" the beta emission.
5. Unwanted beta emissions are easily shielded by the ohmic contacts that may be formed at the bottom of the structure along with, in some embodiments, an additional metal layer deposited on top of the structure.

Passivation of the Endfire Surface

The advantage of the Endfire betavoltaic concept is the increased area for beta particle input. Therefore, a larger source of energy is available for harvesting, relative to a planar betavoltaic device design. The disadvantage of this approach is that the increase in surface area comes with a potential introduction of surface charges and/or surface traps. Surface charges and/or surface traps can reduce the "effective minority lifetimes" of carriers in the device. The result of these charges is that carrier collection is reduced, which results in lower power output by the device.

Surfaces are literal terminations of crystal lattices and the dangling bonds that are formed as a consequence of this termination create localized energy states that can act as generation-recombination centers. These surface states have the potential to reduce the effective minority carrier lifetimes in devices. When the surface-to-volume ratio of a device increases, as is the case with going from a planar to the Endfire betavoltaic design, the total number of surface states increases, which can reduce the power output.

To mitigate this surface effect in the Endfire design, a novel metal-oxide-semiconductor (MOS) capacitor will be integrated with the betavoltaic device. The MOS device will be formed on the surface between the SiC device sidewalls, the insulating oxide, and the metal radioisotope source. This MOS capacitor will be biased in accumulation mode. (see FIGS. 11 and 12)

Figure 12:
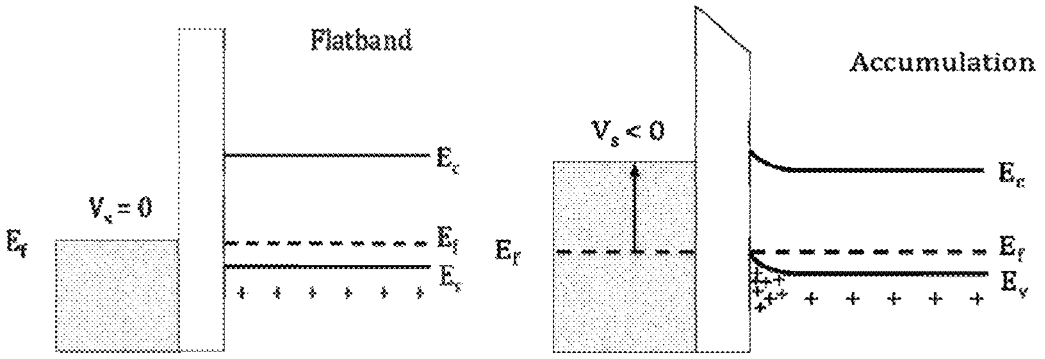
FIGS. 12 (*a-b*) shows: P-type MOS capacitor (a) with $V_g$=0, biased in the flatband mode (b) with $V_g$<0, biased in the accumulation mode.

The MOS capacitor band diagram shown in FIG. 12(*a*) illustrates the flat band mode where there is no voltage bias on the metal terminal. This condition is characterized by the absence of band bending in the SiC and by the absence of charge build up at the surface. As a negative charge is introduced to the metal-semiconductor contact (FIG. 12(*b*)), an electric field is set up across the MOS capacitor. This field attracts the positively charged majority carriers in the p-type SiC to the surface where they quickly accumulate. This particular condition is called the accumulation mode. In the accumulation mode, the majority carrier density is increased at the surface and electric fields are produced which act to repel minority carriers from the surface. The action of the electric field on the minority carriers have the effect of isolating them from the traps. This electric field isolation allows for the Endfire design to be less susceptible to the effects of surface traps.

Biasing the MOS Capacitor:

The integrated MOS capacitor can be biased into accumulation by several sources including, but not limited to, the Endfire betavoltaic's generated voltage and the voltage from fixed oxide charges introduced during the fabrication of the devices.

Since the SiC Endfire betavoltaic will produce an open circuit voltage of 2 Volts, a portion of this voltage can be used to bias the MOS capacitor on the sidewalls. Fixed negative charge can also be implanted into the oxide to permanently bias the MOS capacitor into accumulation. The fixed negative charge will allow the device to remain in accumulation, regardless of the external resistive loads that the device may be connected to and will also simplify the fabrication process of the device, by eliminating the need to connect the negative output of the betavoltaic to the MOS terminal.

Alternate Embodiment of the Endfire Design

Figure 2C:
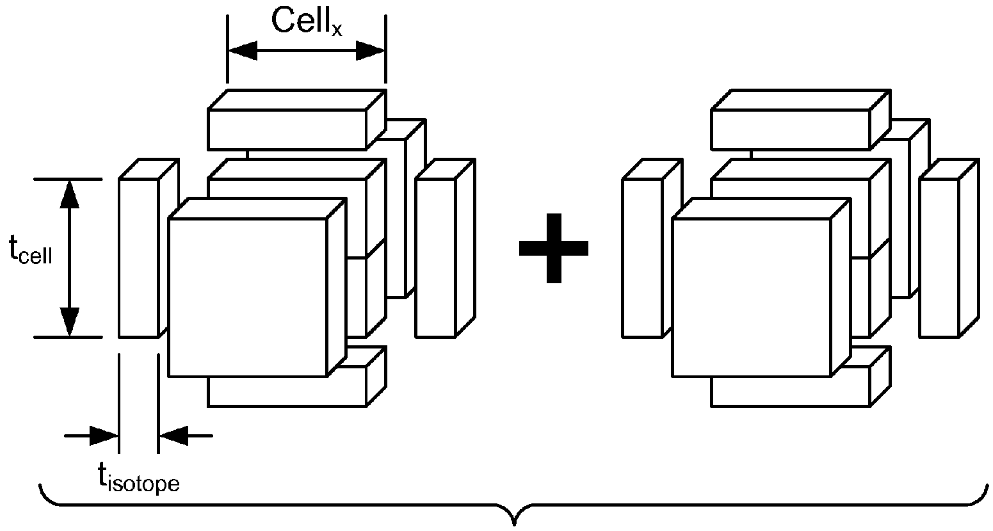
Figure 9:
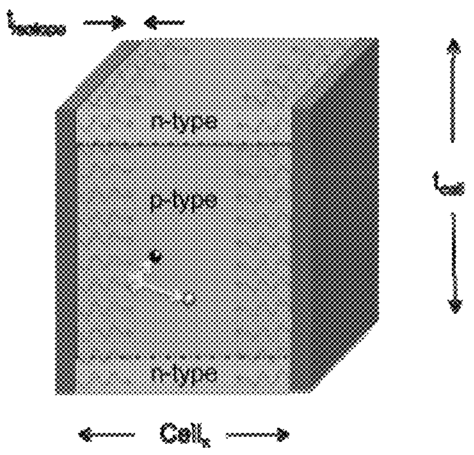
FIG. 9 shows the diagram of $n^+$-$p^-$-$n^+$ embodiment of the Endfire structure.
Figure 10:
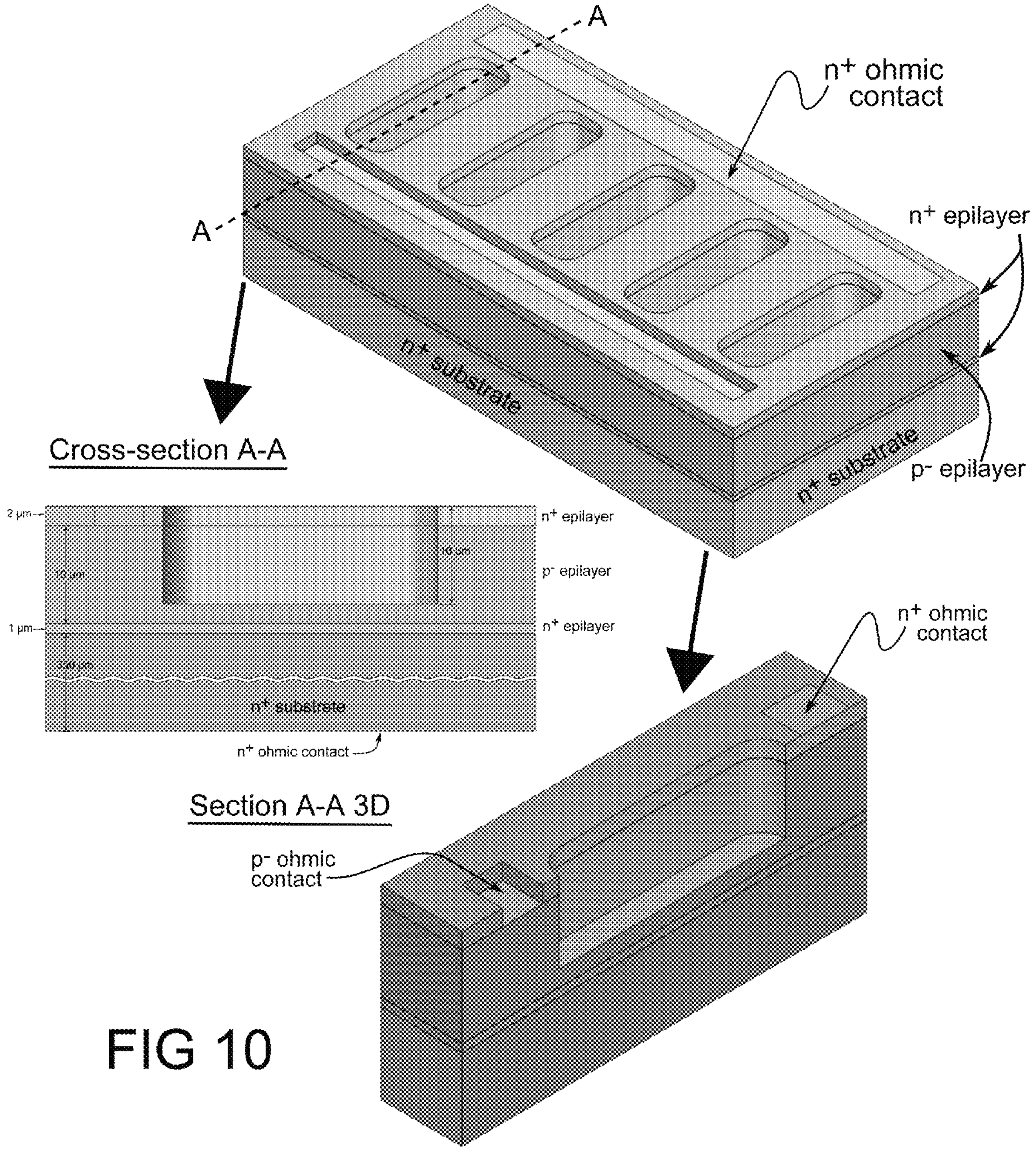
FIG. 10 shows drawing for n-p-n Comb Endfire device.

The Endfire betavoltaic concept can be implemented in different p-n junction configurations. An alternate configuration is shown in FIG. 9. Rather than just being a simple mini p-n junction slab (as the embodiment shown in FIG. 10), there are two back to back p-n junctions in parallel, built into the device, and both harvest beta energy to contribute to the total power output. The structure can be $n^+$-$p^-$-$n^+$ (as shown in FIG. 10), or the mirror structure of $p^+$-$n^-$-$p^+$. The advantages of this embodiment of the device are as follows:

For the $n^+$-$p^-$-$n^+$ structure, the minority carrier lifetimes are larger in p-type material The maximum depth of the device can be increased The total power output is higher Surface passivation is easier to achieve In summary, we have the following figures: FIG. 1 shows schematic of beta voltaic converter, corresponding to FIG. 5. FIGS. 2*a-c* show: Schematic illustration of one embodiment of the invention, corresponding to FIGS. 6*a-c*. The drawing shows a slap converter geometry being replaced by a number of cube-based converters. FIG. 3 shows: Schematic of a beta voltaic device embodiment, corresponding to FIG. 7. FIG. 4 shows a 3D representation, corresponding to FIG. 8. For clarity, space is inserted between the isotope vertical slabs. Ohmic contacts are formed in the rear of the device and on the devices bottom side.

Figure 5:
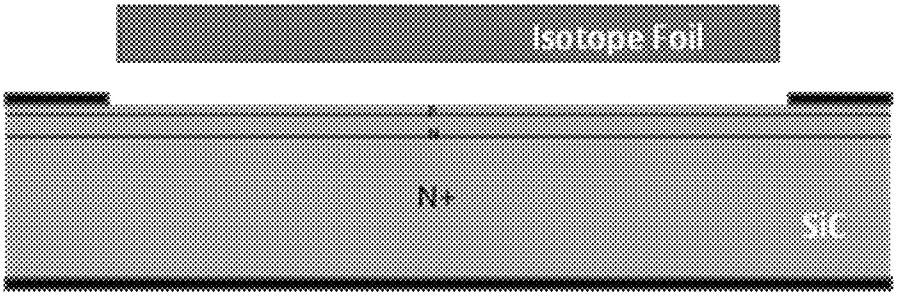
FIG. 5 shows schematic of beta voltaic converter: green region is the SiC power converter, the blue region is the radio isotope, while the black regions are the ohmic contacts.
Figure 6:
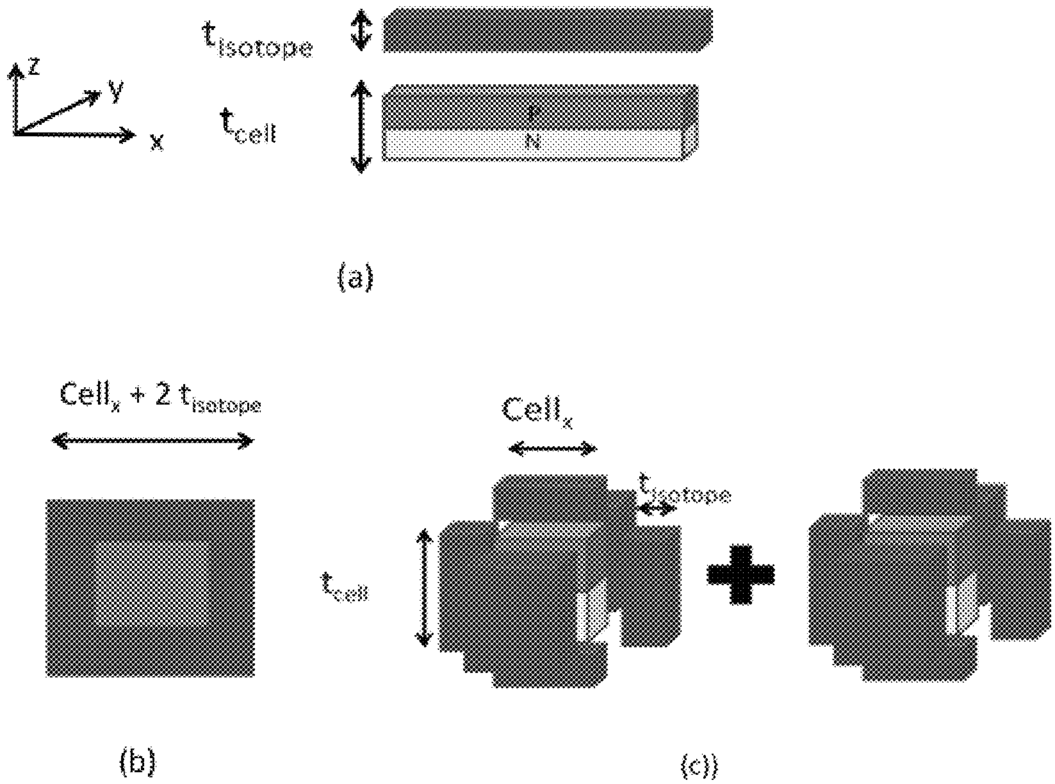
FIGS. 6*a-c* show: Schematic illustration of one embodiment of the invention. The drawing shows a slap converter geometry being replaced by a number of cube-based converters.
Figure 7:
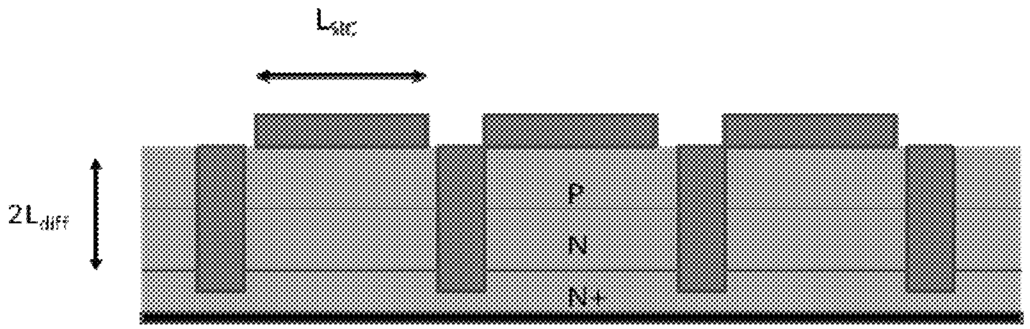
FIG. 7 shows: Schematic of a beta voltaic device embodiment: Green region is the SiC power converter, the blue region is the radio isotope, while the black regions are the ohmic contacts.

FIG. 5 shows schematic of beta voltaic converter: green region is the SiC power converter, the blue region is the radio isotope, while the black regions are the ohmic contacts. FIGS. 6*a-c* show: Schematic illustration of one embodiment of the invention. The drawing shows a slap converter geometry being replaced by a number of cube-based converters. FIG. 7 shows: Schematic of a beta voltaic device embodiment:

Green region is the SiC power converter, the blue region is the radio isotope, while the black regions are the ohmic contacts.

Figure 8:
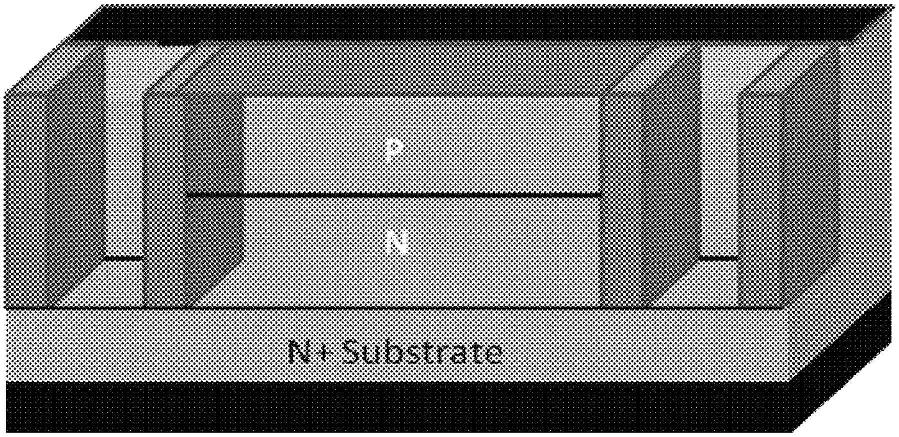
FIG. 8 shows a 3D representation. For clarity, space is inserted between the isotope vertical slabs. Ohmic contacts are formed in the rear of the device and on the devices bottom side and these contacts are shown in black.

FIG. 8 shows a 3D representation. For clarity, space is inserted between the isotope vertical slabs. Ohmic contacts are formed in the rear of the device and on the devices bottom side and these contacts are shown in black.

Figure 11:
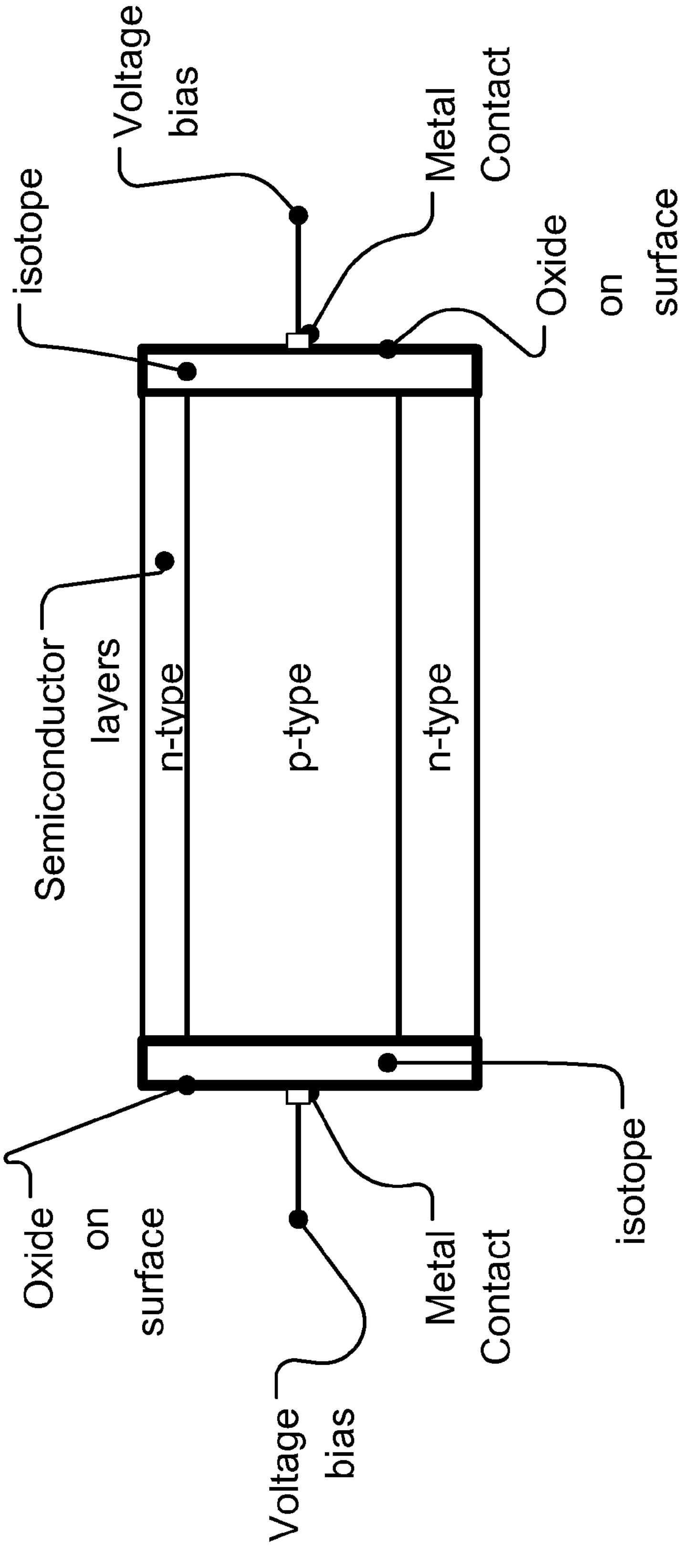
FIG. 11 shows: MOS capacitor formed on sidewall of the Endfire Betavoltaic device.

FIG. 9 shows the diagram of $n^+$-$p^-$-$n^+$ embodiment of the Endfire structure. FIG. 10 shows drawing for n-p-n Comb Endfire device. FIG. 11 shows: MOS capacitor formed on sidewall of the Endfire Betavoltaic device. FIG. 12 shows: P-type MOS capacitor (a) with $V_g$=0, biased in the flatband mode (b) with $V_g$<0, biased in the accumulation mode.

Maximizing Charge Collection in SiC Betavoltaics—Influence of Junction Depth

This is also addressed in our co-pending applications, mentioned above: To quantify the extent of the surface, it is necessary to know the penetration depth, or range, $R_B$ in μm, of the beta electron in the semiconductor, which is given as:

$$R_B\ (\mu m)=[4\times E_0^{1.75}\ (keV)/100]/\rho(g/cm^3) \quad (1e),$$

where $E_0$ is the incident beta energy in keV, and ρ is the density of the semiconductor in g/cm$^3$. The penetration depth is simply a function of the energy spectrum of the β-radiation, which is known. The spectrum, to first order, is given by $$f(E_0)=K\sqrt{E_0^2+2mc^2E_0}(E_0(\max)-E_0)^2 \quad (2e)$$

where f(E) is the energy distribution function, m the electronic mass, c the speed of light, and K a normalization constant, such that we have:

$$\int_0^{E_0(max)} f(E_0)dE_0=1 \quad (3e)$$

The energy extends to a maximum, $E_0$(max), that typically lies at ~3 times the mean energy. For a given beta emitting isotope, a single $E_0$(max) completely specifies the spectrum, as eq. 2e indicates. There is a Coulombic penetration factor that modifies equation (2e) above. This factor accounts for electrons being retarded by the Coulombic attraction from the nucleus, which skews the spectrum towards lower energies. Considering this factor, equation (2e) becomes:

$$f(E_0)=KF(Z_D,E_0)\sqrt{E_0^2+2mc^2E}(E_0(\max)-E_0)^2 \quad (4e)$$

where $F(Z_D,E_0)$, called the Fermi function, takes into account the Coulombic penetration effects. This function is tabulated in relevant semiconductor literature, and is related to the daughter nucleus atomic number, $Z_D$, and the energy of the emitted β particle, $E_0$. It can be approximated by:

$$F(Z_D,E_0)=\frac{2\pi v}{1-\exp(-2\pi v)} \quad (5e)$$

where $$v=1.16\times10^{-3}Z_D\Big/\sqrt{\frac{E_0^2+2mc^2E_0}{m^2c^4+E_0^2+2mc^2E_0}}$$

The penetration depth is then estimated as described in equation (1e). From (4e), ~65% of the spectrum energy lies at or below the mean, 5.5 keV for Tritium, while >80% of the energy lies below E(max)/2, which is ~9 keV for Tritium.

Assuming that all the beta-generated electron-holes beyond the surface junction p-type layer are collected, while none of those generated in the surface junction layer are collected, we can estimate the charge collection as a function of energy, or as simply the fraction of the total path length ($R_B$) that lies beyond the junction region ($X_j$). This fraction at each energy in the beta spectrum is $(R_B-X_j)/R_B$. Integrating the total charge collection function, we obtain the total charge collection efficiency. More details and results are given in our co-pending applications, mentioned above, which are incorporated by reference here.

Any variations of the teachings above are also meant to be covered and protected by this current application.

The invention claimed is:

1. A nuclear battery device, said nuclear battery device comprising:

a P-N semiconductor junction, located between a P-type semiconductor layer and an N-type semiconductor layer;

two or more contacts;

two isotope foils;

wherein said two or more contacts are connected to said P-type semiconductor layer and said N-type semiconductor layer; and wherein said P-type semiconductor layer and said N-type semiconductor layer are sandwiched between said two isotope foils;

wherein each of said two isotope foils are covered by an oxide layer;

wherein each of said oxide layer is connected to a metal contact;

a metal-oxide-semiconductor capacitor;

wherein said metal-oxide-semiconductor capacitor comprises said sandwiched said P-type semiconductor layer and said N-type semiconductor layer, surrounded on each side by said two isotope foils, surrounded on each side by each of said oxide layer, which is connected on each side by each of said metal contact.

2. The nuclear battery device as recited in claim 1, wherein said metal-oxide-semiconductor capacitor is biased in accumulation mode.

3. The nuclear battery device as recited in claim 1, wherein surface charges and surface traps are passivated.

4. The nuclear battery device as recited in claim 1, wherein power output of said nuclear battery device is increased.

5. The nuclear battery device as recited in claim 1, wherein surface dangling bonds, surface localized energy states, or surface generation-recombination centers are reduced.

6. The nuclear battery device as recited in claim 1, wherein effective minority carrier lifetimes are increased.

7. The nuclear battery device as recited in claim 1, wherein negative charge is introduced at metal-semiconductor contact.

8. The nuclear battery device as recited in claim 1, wherein an electric field is set up across said metal-oxide-semiconductor capacitor.

9. The nuclear battery device as recited in claim 1, wherein majority carrier density is increased at surface.

10. The nuclear battery device as recited in claim 1, wherein electric fields are produced which repel minority carriers from surface.

11. The nuclear battery device as recited in claim 1, wherein said metal-oxide-semiconductor capacitor is biased by betavoltaic's generated voltage.

12. The nuclear battery device as recited in claim 1, wherein said metal-oxide-semiconductor capacitor is biased by voltage from fixed oxide charges introduced during fabrication of said nuclear battery device.

13. The nuclear battery device as recited in claim 1, wherein fixed negative charge is implanted into oxide.

14. The nuclear battery device as recited in claim 1, wherein said metal-oxide-semiconductor capacitor is permanently biased into accumulation mode.

15. The nuclear battery device as recited in claim 1, said nuclear battery device comprising: an NPN structure.

16. The nuclear battery device as recited in claim 1, said nuclear battery device comprising: a PNP structure.

17. The nuclear battery device as recited in claim 1, wherein said P-type semiconductor layer and said N-type semiconductor layer are SiC semiconductor.

18. The nuclear battery device as recited in claim 1, wherein structure of said nuclear battery device comprises multiple junctions.

19. The nuclear battery device as recited in claim 1, wherein structure of said nuclear battery device comprises an amorphous layer.

20. The nuclear battery device as recited in claim 1, wherein structure of said nuclear battery device comprises at least one of the following: isotopes Nickel-63, Tritium, Scandium Tritide, Titanium Tritide, or Promethium-147.

* * * * *